(12) United States Patent
Mueller et al.

(10) Patent No.: US 9,281,656 B2
(45) Date of Patent: Mar. 8, 2016

(54) RIDGE LASER

(71) Applicant: OSRAM Opto Semiconductors GmbH, Regensburg (DE)

(72) Inventors: Jens Mueller, Regensburg (DE); Adrian Stefan Avramescu, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/416,625

(22) PCT Filed: Jun. 3, 2013

(86) PCT No.: PCT/EP2013/061396
§ 371 (c)(1),
(2) Date: Jan. 22, 2015

(87) PCT Pub. No.: WO2014/016024
PCT Pub. Date: Jan. 30, 2014

(65) Prior Publication Data
US 2015/0194788 A1 Jul. 9, 2015

(30) Foreign Application Priority Data

Jul. 24, 2012 (DE) .......................... 10 2012 106 687

(51) Int. Cl.
*H01S 5/042* (2006.01)
*H01S 5/20* (2006.01)
*H01S 5/22* (2006.01)
(Continued)

(52) U.S. Cl.
CPC ............. *H01S 5/0425* (2013.01); *H01S 5/2009* (2013.01); *H01S 5/2018* (2013.01); *H01S 5/22* (2013.01); *H01S 5/221* (2013.01); *H01S 5/2222* (2013.01); *H01S 5/2231* (2013.01); *H01S 5/2232* (2013.01); *H01S 5/34333* (2013.01);
(Continued)

(58) Field of Classification Search
CPC . H01S 5/0425; H01S 5/34333; H01S 5/2018; H01S 5/22; H01S 5/2222; H01S 5/2232; H01S 5/221; H01S 5/2231; H01S 5/2009; H01S 5/2206
USPC .......................... 372/39, 43.01, 44.01, 45.01
See application file for complete search history.

(56) References Cited

U.S. PATENT DOCUMENTS

| 5,383,211 A | 1/1995 | Van de Walle et al. |
| 5,399,885 A | 3/1995 | Thijs et al. |

(Continued)

FOREIGN PATENT DOCUMENTS

| DE | 19963807 A1 | 7/2001 |
| DE | 102004037868 A1 | 11/2005 |

(Continued)

*Primary Examiner* — Dung Nguyen
(74) *Attorney, Agent, or Firm* — McDermott Will & Emery LLP (57) ABSTRACT

In at least one embodiment, the bar laser (1) has a semiconductor layer sequence (2) with an active zone (20). A waveguide (3) with a defined width (B) is formed as an elevation from the semiconductor layer sequence (2). A contact metallization (4) is applied to an upper side (30) of the waveguide (3) facing away from the active zone (20). A current flow layer (5) is in direct contact with the contact metallization (4). The contact metallization (4) is electrically connected via the current flow layer (5). A current flow width (C) of the active zone (20) and/or the waveguide (3) is less than the width (B) of the waveguide (3).

19 Claims, 5 Drawing Sheets (51) Int. Cl.
*H01S 5/223* (2006.01)
*H01S 5/343* (2006.01)

(52) U.S. Cl.
CPC ......... *H01S 5/2206* (2013.01); *H01S 2301/166* (2013.01); *H01S 2301/176* (2013.01)

(56) References Cited

U.S. PATENT DOCUMENTS

| | | |
|---|---|---|
| 6,844,565 B2 | 1/2005 | Lell et al. |
| 7,817,692 B2 | 10/2010 | Matsumura et al. |
| 2003/0138981 A1 | 7/2003 | Yamaguchi et al. |
| 2006/0018352 A1 | 1/2006 | Song et al. |
| 2006/0187988 A1 | 8/2006 | Tanaka |
| 2007/0041413 A1 | 2/2007 | Kwak et al. |
| 2011/0121337 A1* | 5/2011 | Shakuda ........................ 257/98 |

FOREIGN PATENT DOCUMENTS

| | | |
|---|---|---|
| DE | 102004036963 A1 | 12/2005 |
| DE | 102006046297 A1 | 4/2008 |
| JP | 2000294875 A | 10/2000 |
| JP | 2002359436 A | 12/2002 |
| JP | 2003243775 A | 8/2003 |

\* cited by examiner

RIDGE LASER

A ridge laser is specified.

An object to be achieved is to specify a ridge laser having a high efficiency, in particular at low current densities.

This object is achieved inter alia by means of a ridge laser comprising the features of the independent patent claim. The dependent claims relate to preferred developments.

In accordance with at least one embodiment, the ridge laser comprises a semiconductor layer sequence, in particular exactly one semiconductor layer sequence. The semiconductor layer sequence comprises one or a plurality of active zones. The at least one active zone comprises a single quantum well structure or, preferably, a multi quantum well structure. During use of the ridge laser as intended, electromagnetic radiation is generated in the active zone, for example in the spectral range of between 300 nm and 1500 nm inclusive, preferably between 380 nm and 600 nm inclusive. The generated radiation is coherent laser radiation during use of the ridge laser as intended.

The semiconductor layer sequence is based, in particular, on a III-V compound semiconductor material. The semiconductor material is preferably a nitride compound semiconductor material such as $Al_nIn_{1-n-m}Ga_mN$ or else a phosphide compound semiconductor material such as $Al_nIn_{1-n-m}Ga_mP$ or an arsenide compound semiconductor material such as $Al_nIn_{1-n-m}Ga_mAs$, wherein in each case $0 \leq n \leq 1$, $0 \leq m \leq 1$ and $n+m \leq 1$. Here the semiconductor layer sequence can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

In accordance with at least one embodiment, the ridge laser is an edge emitting semiconductor laser.

In accordance with at least one embodiment, the ridge laser comprises a ridge. Hereinafter, the term ridge is designated synonymously with the term waveguide, since the ridge is essential for guiding radiation in a direction parallel to a main extension direction of the semiconductor layer sequence. The guiding of radiation in a direction perpendicular to the main extension direction, that is to say parallel to a growth direction of the semiconductor layer sequence, takes place in particular through layers of the semiconductor layer sequence which are at least partly not encompassed by the actual ridge. In this connection, therefore, the term waveguide relates to waveguiding in a direction parallel to the main extension direction.

The ridge or else waveguide is shaped from the semiconductor layer sequence. The waveguide is thus embodied as an elevation above remaining regions of the semiconductor layer sequence, in a direction parallel to a growth direction of the semiconductor layer sequence. In other words, the waveguide is formed from a material of the semiconductor layer sequence. A material of the semiconductor layer sequence is removed on both sides of the waveguide. The waveguide extends along an emission direction and/or a resonator longitudinal direction of the ridge laser. Besides ridge, the synonymous term here, such a waveguide can also be designated as a ridge waveguide.

In accordance with at least one embodiment, the ridge laser comprises a contact metallization. The contact metallization is situated on a top side of the waveguide facing away from the active zone. In particular, the contact metallization touches a semiconductor material of the semiconductor layer sequence that shapes the top side. The contact metallization is preferably shaped from a metal or from a metal alloy. Alternatively or additionally, it is possible for the contact metallization to be formed from a semiconductor material which has metallic properties or substantially metallic properties by means of a corresponding doping.

In accordance with at least one embodiment, the ridge laser comprises one or a plurality of energization layers. The at least one energization layer is in direct contact with the contact metallization. The energization layer is designed to electrically connect the contact metallization. By way of example, the energization layer is embodied as a conductor track structure. The energization layer can extend at least partly over the top side of the waveguide, as seen in plan view.

In accordance with at least one embodiment, an energization width of the active zone and/or of the waveguide is less than the width of the waveguide. The energization width is that width within which the active zone is supplied with a current above a threshold current for generating laser radiation during use of the ridge laser as intended. That is to say that, within the energization width, laser radiation is generated in the active zone during use as intended. The energization width of the waveguide is that width at the top side within which a current is impressed into the waveguide through the contact metallization.

The stated widths relate, in particular, to a direction parallel to a main extension direction of the active zone and perpendicular to a main emission direction of the ridge laser or to a resonator longitudinal direction. The resonator longitudinal direction can be defined by facets acting as resonator mirrors and is preferably oriented perpendicularly to such facets.

According to at least one embodiment, the ridge laser comprises a semiconductor layer sequence comprising an active zone. A waveguide having a specific width is shaped as an elevation from the semiconductor layer sequence. A contact metallization is applied on a top side of the waveguide facing away from the active zone. An energization layer is in direct contact with the contact metallization. The contact metallization is electrically connected via the energization layer. An energization width of the active zone and/or an energization width of the waveguide are/is less than the width of the waveguide.

In conventional lasers comprising a ridge waveguide, referred to as RWG lasers, a width of the waveguide firstly defines a lower limit for a width of the energization of the active zone. Secondly, the width of the waveguide in combination with the optical refractive indices of the materials used also defines a width of the optical mode in a direction perpendicular to a longitudinal extent of the waveguide. Consequently, in the case of such lasers, the energization width in the active zone can be greater than a mode width. However, since the stimulated emission during laser operation takes place only in a region within the mode width, charge carrier recombination takes place in a part—going beyond that—of the then larger energization width. In this partial region not situated within the mode width, the charge carrier recombination does not take place in a stimulated fashion and therefore does not contribute to the laser activity. This results in an increased laser threshold current and a poorer efficiency of the laser component.

In a waveguide, as indicated, the optical mode width is defined by means of the width of the waveguide and by means of the refractive indices of the materials involved. By contrast, the energization width can be set by means of the contact metallization at the top side and/or by means of current blocking layers within the semiconductor layer sequence. As a result, the optical mode width can be set independently of the energization width of the active zone. It is thus possible to achieve an increased overlap or a complete congruence of the energization width with the optical mode width in the active zone. Therefore, a greater portion of the current with which the semiconductor layer sequence is energized is available for the stimulated emission to form the laser radiation. The laser threshold current is reduced as a result.

In accordance with at least one embodiment, the waveguide is spaced apart from the active zone. That is to say that the active zone is preferably a continuous layer. Preferably no material of the active zone is removed during production of the waveguide. By way of example, the waveguide extends toward the active zone to at most 30 nm away from the latter, in a direction perpendicular to the active zone.

In accordance with at least one embodiment, the top side of the waveguide is only partly covered by the contact metallization. A contact width of the contact metallization is then less than the width of the waveguide.

In accordance with at least one embodiment, the energization layer touches the top side in places. That is to say that a material of the energization layer is then in direct contact with the semiconductor material that forms the top side. As viewed in cross section and in a direction parallel to the active zone, a material of the energization layer is then preferably situated on both sides of the contact metallization at the top side.

In accordance with at least one embodiment, a distance between the contact metallization and an edge of the top side of the waveguide is at least 150 nm or at least 300 nm. Alternatively or additionally, said distance is at least 2.5% or at least 5% of the width of the waveguide. In this case, the distance is determined in a direction parallel to the active zone and in a plane perpendicular to the longitudinal extent of the waveguide.

In accordance with at least one embodiment, a passivation layer is situated in places between the semiconductor layer sequence and the energization layer. The passivation layer completely or partly covers in particular such regions of the semiconductor layer sequence which do not shape the waveguide. Flanks and/or the top side of the waveguide can be partly or completely covered by the passivation layer. The passivation layer is preferably formed from an electrically insulating material and/or from a material having a comparatively low optical refractive index, for instance of at most 1.6 or of at most 1.5.

In accordance with at least one embodiment, the ridge laser has a coverage portion of the top side by the energization layer. The coverage portion is that portion of the top side of the waveguide which, in a direction parallel to the width of the waveguide, is in direct contact with the energization layer.

In accordance with at least one embodiment, one or more of the relationships mentioned below hold true for the contact width M, the width B of the waveguide and the coverage portion S: $0.05B \leq M$, $0.1B \leq M$, $M \leq 0.8B$, $M \leq 0.65B$, $0.3(B-M) \leq S$, $0.4(B-M) \leq S$, $S \leq (B-M)$, $S \leq 0.9(B-M)$.

In accordance with at least one embodiment, a plurality of strips of the contact metallization are fitted to the top side of the waveguide. Adjacent strips of the contact metallization preferably run parallel and spaced apart with respect to one another. The strips preferably in each case run parallel to a longitudinal extent of the waveguide, that is to say preferably perpendicular to the width of the waveguide and parallel to the active zone.

In accordance with at least one embodiment, a distance between adjacent strips of the contact metallization is at least 1 μm or at least 2 μm. Alternatively or additionally, said distance is at most 10 μm or at most 6 μm or at most 4.5 μm.

In accordance with at least one embodiment, a total width of all the strips of the contact metallization taken together is at least 15% or at least 25% or at least 40% of the width of the waveguide. Alternatively or additionally, said total width is at most 90% or at most 80% or at most 65%.

In accordance with at least one embodiment, all the strips of the contact metallization are electrically connected in parallel. That is to say that the strips then cannot be electrically driven individually. As an alternative thereto, it can also be possible for the strips to be electrically driven in each case independently of one another.

In accordance with at least one embodiment, the top side is shaped in a planar fashion. In other words, the top side then runs parallel to the active zone. No depressions such as trenches or holes are then shaped into the top side.

In accordance with at least one embodiment, the energization layer partly or completely touches flanks of the waveguide. As viewed in cross section, the flanks are covered by the energization layer preferably in a proportion of at most 80% or of at most 60% or of at most 40% and/or at least 10% or at least 20%.

In accordance with at least one embodiment, the flanks of the waveguide are at an angle with respect to the active zone of 90°, with a tolerance of at most 15° or of at most 5°. In other words, the flanks are then oriented perpendicularly or approximately perpendicularly to the active zone and preferably also perpendicularly to the main emission direction of the ridge laser.

In accordance with at least one embodiment, the ridge laser is a monomode laser. That is to say that exactly one optical mode is guided in the waveguide and in the semiconductor layer sequence during use of the ridge laser as intended. The width of the waveguide is preferably at least 0.8 μm or at least 1.0 μm or at least 1.3 μm. Alternatively or additionally, the width of the waveguide is at most 4 μm or at most 3 μm or at most 2.5 μm.

In accordance with at least one embodiment, the waveguide has a uniform constant width along an entire longitudinal extension, within the scope of the production tolerances. In other words, there are then no or no significant fluctuations in the width of the waveguide.

In accordance with at least one embodiment, the ridge laser is a multimode laser, such that a plurality of optical modes are guided in the waveguide and in the semiconductor layer sequence during use as intended. The width of the waveguide is then preferably at least 2 μm or at least 3 μm or at least 5 μm or at least 10 μm. It is likewise possible for the width to be at most 200 μm or at most 50 μm or at most 40 μm or at most 35 μm.

In accordance with at least one embodiment, the semiconductor layer sequence is based on the material system AlInGaN. A distance between the waveguide and the active zone is furthermore preferably at least 30 nm or at least 50 nm. The distance between the waveguide and the active zone, in a direction perpendicular to the active zone, can likewise be at most 1.0 μm or at most 400 nm or at most 200 nm.

In accordance with at least one embodiment, the contact metallization is shaped from such a material such that an ohmic contact is formed with the semiconductor layer sequence. Ohmic contact means, in particular, that a current-voltage characteristic approximately follows a linear profile, within the parameter range for the operation of which the ridge laser is designed.

In accordance with at least one embodiment, the energization layer is shaped from such a material such that a non-ohmic contact is formed with the semiconductor layer sequence. The material of the contact metallization relative to the semiconductor layer sequence preferably has a higher work function than the material of the energization layer relative to the semiconductor layer sequence. Furthermore, the material of the energization layer preferably has a good electrical conductivity and a small shading length of electric fields.

In accordance with at least one embodiment, the energization layer comprises one of the following materials or consists of one or more of the following materials: Au, Ni, Ti, ZnO:Al, $Z_n$O:$G_a$, ITO. Preferably, the energization layer is formed from Au or from Ti. It is possible for the energization layer to be shaped from a plurality of individual layers also of different materials. In this case, it is possible for layers of the energization layer which are not in direct contact with the top side to be formed from materials other than those mentioned.

In accordance with at least one embodiment, the contact metallization is formed from one or from a plurality of the materials mentioned below or comprises such materials: Pd, Ti, Pt, Ni, ZnO:Al, ZnO:Ga, ITO. The work function of the oxidic materials presented can be set by means of corresponding doping.

In accordance with at least one embodiment, a height of the waveguide is at least 200 nm or at least 100 nm. Alternatively or additionally, the height of the waveguide is at most 1.2 μm or at most 7 μm.

In accordance with at least one embodiment, the semiconductor layer sequence comprises one or a plurality of current blocking layers. The at least one current blocking layer is designed to prevent or significantly reduce a current flow through the material of the current blocking layer on account of its material properties. One or a plurality of openings is or are shaped in the current blocking layer. The at least one opening, in plan view, is preferably partly or completely covered by the waveguide. With further preference, the opening has a smaller width than the waveguide. In plan view, the opening can have the same basic shape as the waveguide.

In accordance with at least one embodiment, the current blocking layer is at a distance from the active zone of at most 1000 nm or at most 500 nm. Alternatively or additionally, said distance is at least 50 nm or at least 100 nm.

In accordance with at least one embodiment, the current blocking layer or one of the current blocking layers is situated at a side of the active zone facing away from the waveguide. Alternatively, it is possible for the current blocking layer or one of the current blocking layers to be situated between the active zone and the waveguide or for the current blocking layer or one of the current blocking layers to be fitted within the waveguide.

In accordance with at least one embodiment, a width of the opening of the current blocking layer deviates from a width of the waveguide by at most a factor of 2 or by at most a factor of 1.5 or by at most a factor of 1.1. Preferably, the opening is narrower than the waveguide.

In accordance with at least one embodiment, the semiconductor layer sequence comprises one or a plurality of charge carrier blocking layers. The at least one charge carrier blocking layer is preferably situated near the current blocking layer. This can mean that a distance between the current blocking layer and the charge carrier blocking layer is at most 400 nm.

In accordance with at least one embodiment, the active zone is situated between the charge carrier blocking layer and the current blocking layer. Alternatively, it is possible for the charge carrier blocking layer to be situated between the active zone and the current blocking layer or for the current blocking layer to be arranged between the active zone and the charge carrier blocking layer.

A ridge laser described here is explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

Figure 1:
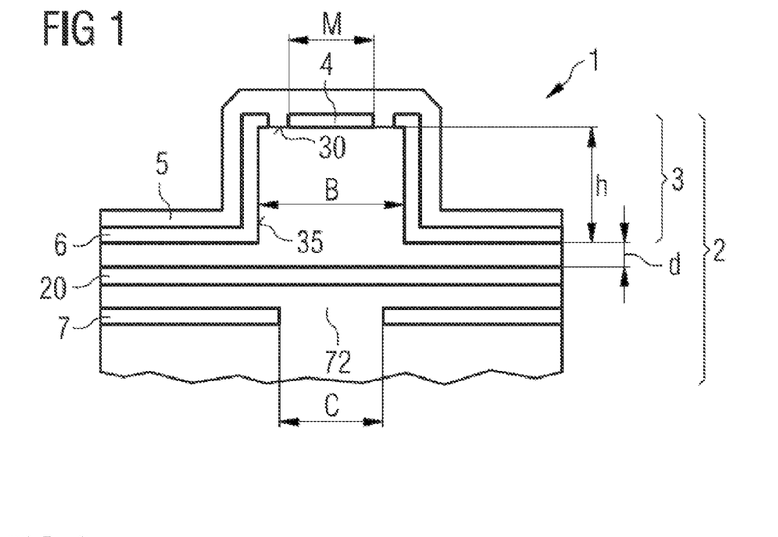
FIGS. 1 to 12 show schematic sectional illustrations of exemplary embodiments of ridge lasers described here.

An exemplary embodiment of a ridge laser 1 is indicated in a sectional illustration in FIG. 1. The ridge laser 1 comprises a semiconductor layer sequence 2. A waveguide 3 in the form of an elevation is formed out of the semiconductor layer sequence 2. The waveguide 3 has a width B. The semiconductor layer sequence 2 furthermore comprises an active zone 20 for generating electromagnetic radiation.

The waveguide 3 has a top side 30 oriented parallel to the active zone 20. Lateral boundary surfaces of the waveguide 3 are formed by flanks 35. The flanks 35 are oriented perpendicular to the active zone 20. The waveguide 3 has a main extension direction perpendicular to the plane of the drawing. A resonator of the ridge laser 1 is likewise oriented perpendicular to the plane of the drawing. As also in all the other sectional illustrations, the laser radiation generated in the ridge laser 1 propagates within the semiconductor layer sequence 2 perpendicular to the plane of the drawing.

The waveguide 3 fashioned as an elevation is unstructured, such that the waveguide has a rectangular basic shape as viewed in cross section. A height h of the waveguide is approximately 0.6 μm, for example. In general, the height h is less than the width B. Furthermore, the waveguide 3 is spaced apart from the active zone 20. A distance d between the active zone 20 and the waveguide 3 is approximately 100 nm, for example.

The regions of the semiconductor layer sequence 2 alongside the waveguide 3 and also the flanks 35 and an edge region of the top side 30 are covered by a passivation 6. A width of the edge region is, for example, at most 10% or at most 15% and/or at least 2% of the width B. As also in all the other exemplary embodiments, the passivation is an electrically nonconductive layer composed of an insulator or composed of a semiconductor material having a band gap of at least 4 eV. By way of example, the passivation layer 6 is shaped from one of the materials mentioned below: SiN, SiO, ZrO, TaO, AlO, ZnO. A thickness of the passivation is, for example, between 100 nm and 2 μm inclusive. A contact metallization 4 with a contact width M is applied to the top side 30. Current is impressed into the semiconductor layer sequence 2 via the contact metallization 4.

Furthermore, an energization layer 5 composed of an electrically conductive material is situated at the top side 30 and also at the contact metallization 4. The energization layer 5 touches the top side 30 on both sides of the metallization 4. No or no significant current is impressed into the semiconductor layer sequence 2 via the energization layer 5, in particular at energization intensities near a threshold current for the generation of laser radiation.

Preferably, a material having good thermal conductivity is used as material for the energization layer 5, such that the direct contact with the semiconductor layer sequence 2 brings about an improved heat dissipation, in particular if parts of the flanks 35 are likewise covered directly with the energization layer 5, in contrast to the depiction shown.

Preferably, the semiconductor layer sequence 2 comprises a current blocking layer 7. An opening 72 is formed in the current blocking layer 7. A width of the opening 72 corresponds to an energization width C of the active zone 20. The energization width C and the contact width M are in each case less than the width B of the waveguide 3. It is possible for the energization width C to be less than or else greater than the contact width M. In particular at relatively high current densities, it is also possible for a current flow to take place directly from the energization layer 5 into the semiconductor layer sequence 2. In this case, an energization width can be set efficiently by the current blocking layer 7.

The width B of the waveguide 3 is, for example, between 1 µm and 3 µm inclusive. The contact width M is, for example, between 0.5 µm and 2.9 µm inclusive. The contact metallization 4 is preferably situated centrally on the waveguide 3. In particular, a lateral center of the contact metallization 4 and a lateral center of the top side 30 are less than 300 nm or less than 100 nm apart. If the contact metallization 4 is structured wet-chemically, then it can have a grain boundary roughness of 5 nm to 300 nm.

A gap in a lateral direction, parallel to the active zone 20, between the passivation layer 6 and the contact metallization 4 is preferably at least 50 nm or at least 250 nm and/or at most 2 µm or at most 1.5 µm. The energization layer 5 preferably has a good adhesion to the passivation layer 6.

As also in all the other exemplary embodiments, the waveguide 3 is preferably formed at a p-doped side of the semiconductor layer sequence 2. However, it is likewise also possible for the waveguide 3 to be shaped at an n-doped side. To improve contact between the semiconductor layer sequence 2 and the contact metallization 4, a highly doped semiconductor layer, for example having a dopant concentration of at least $5 \times 10^{18}$ per cm$^3$, is optionally situated directly at the contact metallization 4. Said highly doped semiconductor layer preferably has a thickness of at most 300 nm or of at most 200 nm.

The current blocking layer 7 is grown in particular epitaxially together with the remaining semiconductor layers of the semiconductor layer sequence 2. Preferably, the current blocking layer 7 consists of a semiconductor material having a larger band gap than the adjoining semiconductor layers. The current blocking layer 7 can consist of AlInGaN, wherein an aluminum content is at least 0.1, for example, and an indium content can differ from 0. The current blocking layer 7 can be undoped, with a charge carrier concentration of $5 \times 10^{17}$ per cm$^3$, or else doped, in particular with a dopant which has energetic states near a band gap center of the current blocking layer 7 and enables a poor electrical conductivity outside the opening 72. A thickness of the current blocking layer 7 is, for example, at least 1 nm or at least 5 nm and/or at most 20 nm or at most 50 nm.

In order to reduce current spreading between the current blocking layer 7 and the active zone 20 and thereby to be able to define the energization width C as accurately as possible, the current blocking layer 7 is preferably situated near the active zone 20. If the current blocking layer 7 is situated in a zone of relatively low charge carrier mobility, for example in a p-doped zone or in an intrinsic zone of the semiconductor layer sequence 2, with a free charge carrier concentration of less than $5 \times 10^{17}$ per cm$^3$, the current blocking layer 7 can be comparatively far away from the active zone 20. A distance is then for example between 50 nm and 200 nm inclusive or between 20 nm and 150 nm inclusive. By contrast, if the current blocking layer 7 is situated in a zone of high charge carrier mobility, for instance in an n-doped region, said distance is preferably at least 50 nm and/or at most 500 nm.

A carrier for the semiconductor layer sequence 2 is not depicted in each case in order to simplify the illustration in the figures. Such a carrier can be a growth substrate for the semiconductor layer sequence or a replacement substrate that differs therefrom. Furthermore, in each case electrical contact locations for externally making electrical contact and a second electrode are not illustrated in any of the figures.

Figure 2:
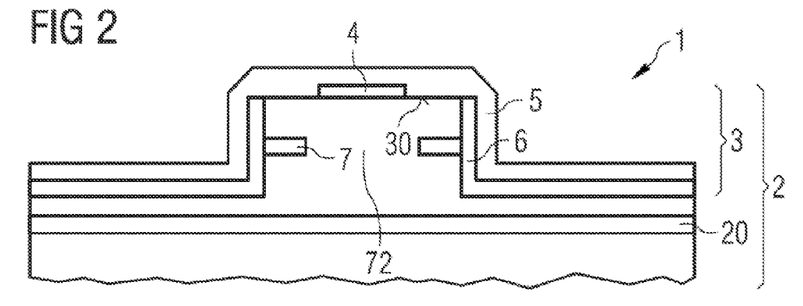

FIG. 2 shows a further exemplary embodiment. In accordance with FIG. 2, the entire top side 30 is covered by the contact metallization 4 together with the energization layer 5. This can also be the case in the exemplary embodiment in accordance with FIG. 1, in contrast to the depiction shown. The current blocking layer 7 is within the waveguide 3.

Figure 3:
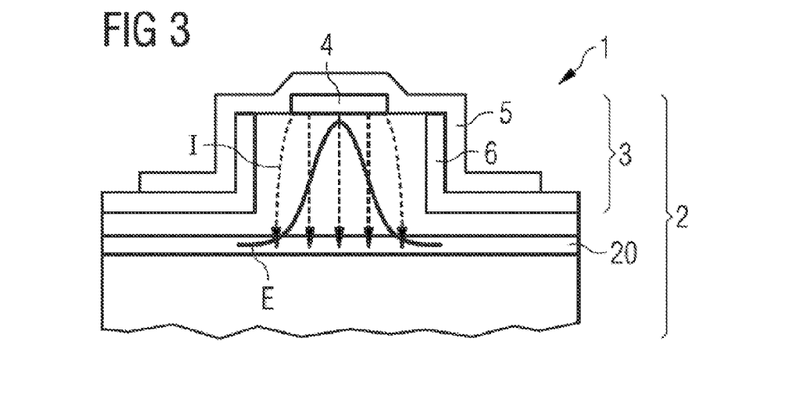

In the exemplary embodiment in accordance with FIG. 3, the semiconductor layer sequence 2 is free of a current blocking layer. An intensity or electric field strength E of the optical mode guided in the ridge laser 1 and current paths I are depicted schematically.

Figure 4:
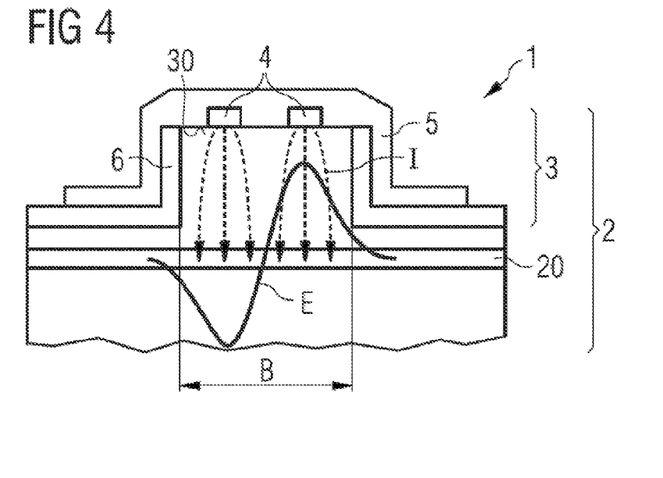

In the exemplary embodiment in accordance with FIG. 4, a plurality of strips of the contact metallization are fitted on the top side 30. Said strips extend perpendicular to the plane of the drawing along the entire waveguide 3. The ridge laser 1 shown in FIG. 4 is a multimode laser. Regions of maximum intensity of the electric field E can be energized more intensely in a targeted manner by means of the strips of the contact metallization 4. In the case of such a multimode laser, a width of the waveguide 3 is preferably between 3 µm and 50 µm inclusive. A distance between adjacent strips is preferably at least 1 µm. The strips are spaced apart from an edge of the top side 30, in a direction parallel to the width B.

Figure 5:
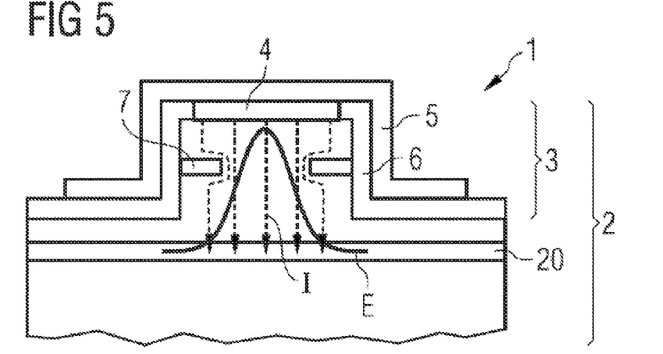
Figure 6:
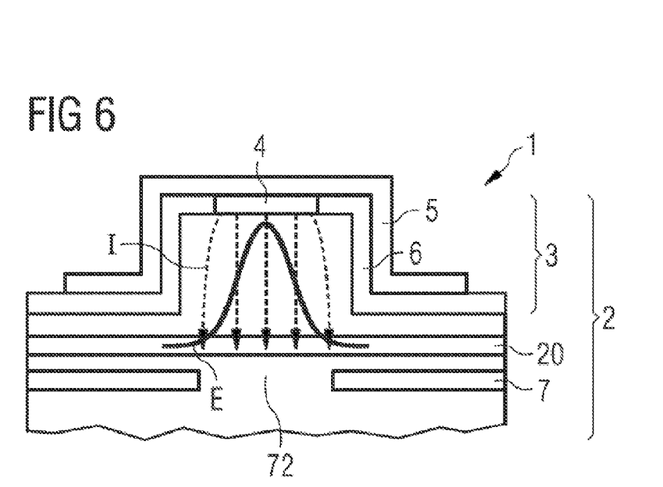

In accordance with FIG. 5, the energization layer is not in direct contact with the semiconductor layer sequence 2. Current limitation is provided solely by the current blocking layer 7 within the waveguide 3. In accordance with FIG. 6, the current blocking layer 7 is situated with the opening 72 at a side of the active zone 20 facing away from the waveguide 3.

Figure 7:
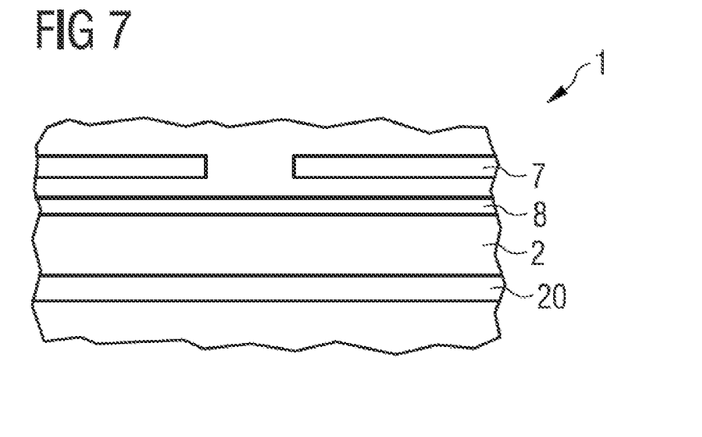
Figure 8:
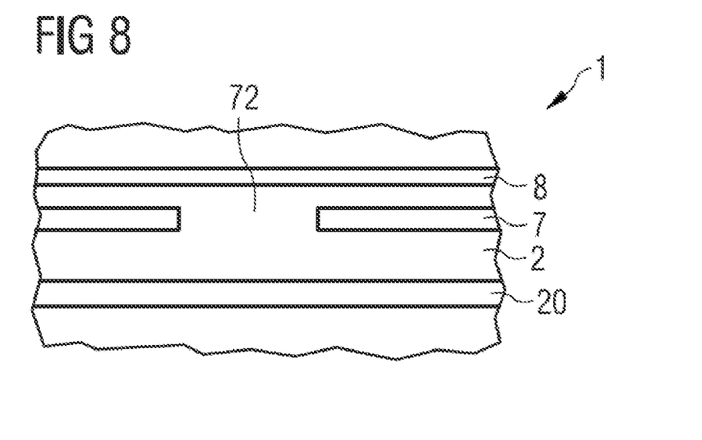
Figure 9:
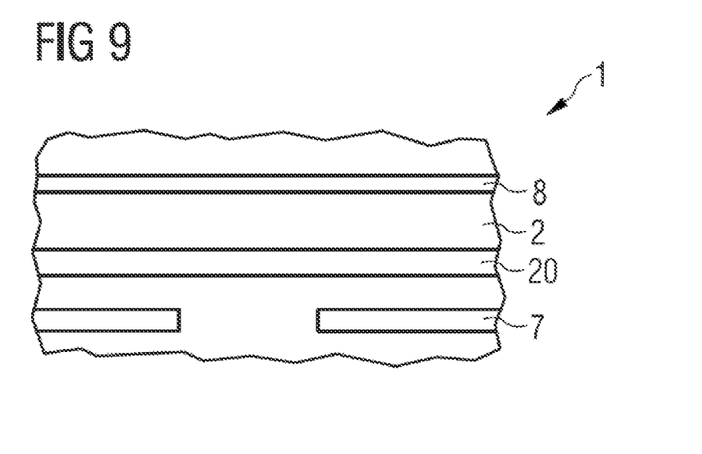

FIGS. 7 to 9 in each case illustrate excerpts from the semiconductor layer sequence 2. The semiconductor layer sequence 2 in each case comprises a charge carrier blocking layer 8. In the case of semiconductor layer sequences 2 having different charge carrier mobilities, such a charge carrier blocking layer 8 serves, in particular, to limit the current flow of the charge carriers having the higher mobility into the zone of the other charge carrier type. Such a charge carrier blocking layer 8 usually also constitutes an additional barrier to the majority charge carriers having lower mobility and can therefore lead to intensified current spreading.

In accordance with FIG. 7, the charge carrier blocking layer 8 is situated between the active zone 20 and the current blocking layer 7. A distance between the charge carrier blocking layer 8 and the current blocking layer 7 is then preferably as small as possible, for example at most 80 nm or at most 60 nm. The charge carrier blocking layer 8 and the current blocking layer 7 can directly succeed one another.

In the exemplary embodiment in accordance with FIG. 8, the current blocking layer 7 is situated between the active zone 20 and the charge carrier blocking layer 8. In this case, the current blocking layer 7, in regions alongside the opening 72, also serves as a charge carrier blocking layer. A distance between the charge carrier blocking layer 8 and the current blocking layer 7 is preferably as small as possible in this case, too, for example between 20 nm and 200 nm inclusive, in particular in order to prevent charge carriers from accumulating between the two layers 7, 8 in regions laterally alongside the opening 72.

In accordance with FIG. 9, the active zone 20 is situated between the layers 7, 8. A distance between the charge carrier blocking layer 8 and the active zone 20 is preferably between 5 nm and 500 nm inclusive or between 20 nm and 250 nm inclusive. The values described in association with the other exemplary embodiments can hold true with regard to the distance between the current blocking layer 7 and the active zone 20.

Figure 10:
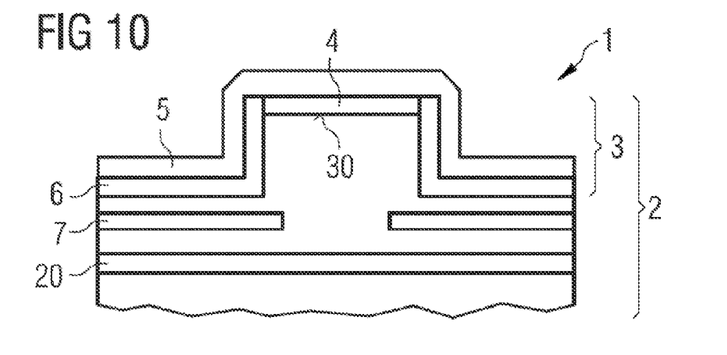

In accordance with FIG. 10, the current blocking layer 7 is fitted between the waveguide 3 and the active zone 20. The waveguide 3 is spaced apart from the current blocking layer 7. The contact metallization 4 completely covers the top side 30 of the waveguide 3. The passivation layer 6 projects beyond the top side 30, in a direction away from the active zone 20, as is also possible in other exemplary embodiments.

Figure 11:
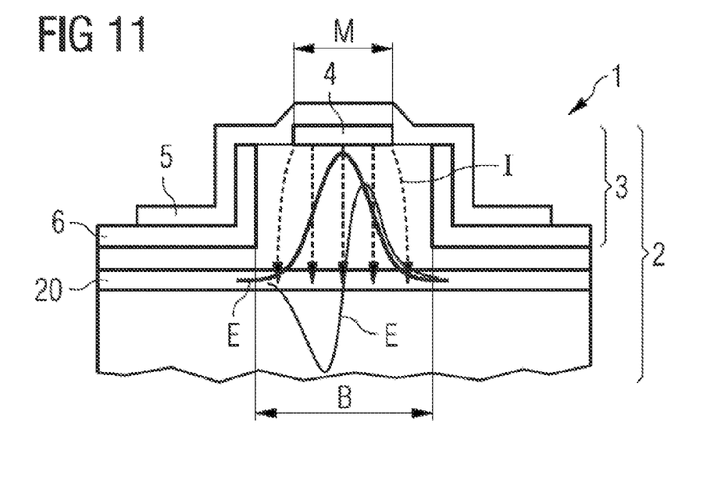

In FIG. 11, the ridge laser 1 is fashioned as a multimode laser. The width B of the waveguide 3 is preferably between 3 µm and 50 µm inclusive. The contact width M is, in particular, between 2.8 µm and 49 µm inclusive and the energization layer 5 covers between 0.2 µm and 47.2 µm inclusive of the top side 30, as viewed in cross section. That region of the top side 30 which is covered by the passivation layer 6 is preferably between 0 µm and 47 µm inclusive, as viewed in cross section.

Figure 12:
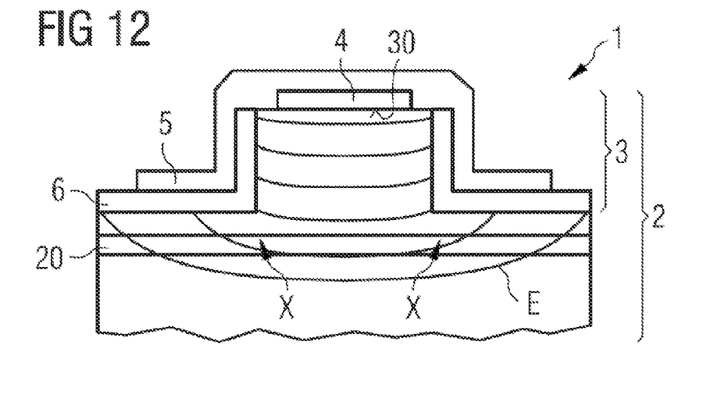
Figure 13:
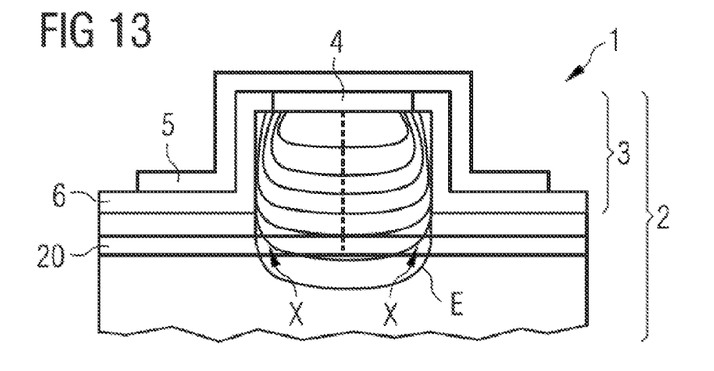
FIGS. 13 and 14 show schematic sectional illustrations of conventional ridge lasers.

A manner of operation of the energization layer 5 situated directly at the top side 30 is explained in greater detail in association with FIGS. 12 and 13. In the exemplary embodiment in accordance with FIG. 12, the energization layer 5 directly at the top side 30, in contrast to the passivation layer 6, cf. FIG. 13, brings about a change in the electric field E in the active zone 20 at an edge x of the optical mode. In the case of nitride-based ridge lasers, in particular, this leads to a reduction of piezoelectric fields at the edge x of the optical mode. This results in a shift in the absorption curve at the edge x toward shorter wavelengths. This provides for lower absorption of light, in particular below the laser threshold, as a result of which the laser threshold can be reduced and a laser characteristic curve having a higher slope can be obtained. Equipotential lines of the electric field E are illustrated in FIGS. 12 and 13.

Figure 14:
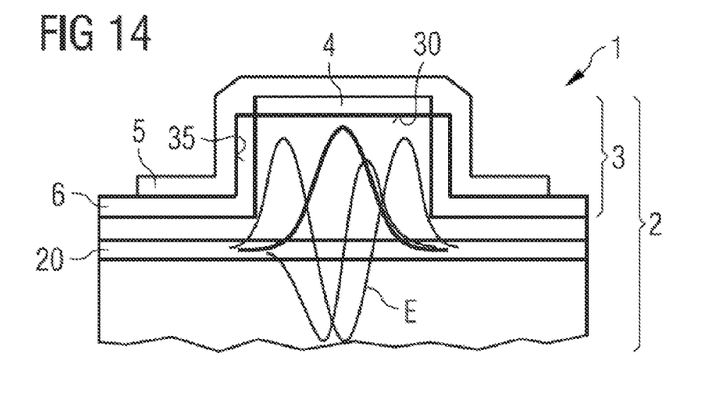

FIG. 14 illustrates, in the case of a conventional ridge laser, that the contact metallization 4 is applied to the entire top side 30. As a result, optical modes having a maximum of the intensity of the electric field B near the flanks 35 of the waveguide 3 are also pumped. These optical modes incur comparatively great losses on account of scattering and absorption at the edge of the waveguide 3 and the passivation layer 6 there. In addition, intensified absorption takes place in that region of the active zone 20 which is not pumped in transparency alongside the waveguide 3, as seen in plan view.

Figure 15:
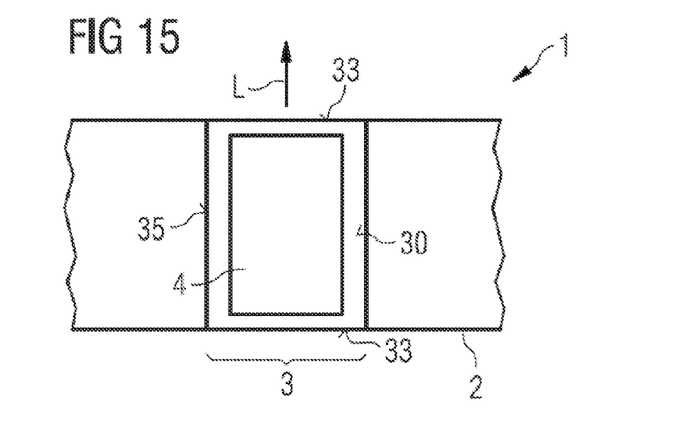
FIG. 15 shows a schematic plan view of an exemplary embodiment of a ridge laser described here.

FIG. 15 shows a schematic plan view of an exemplary embodiment of the ridge laser 1. The energization layer 5 is not illustrated, in order to simplify the illustration. The contact metallization 4 extends along a main light guiding direction L of the waveguide 3. The flanks 35 are oriented parallel to the main light guiding direction L. Facets 33 serving as resonator mirrors are oriented perpendicularly to the main light guiding direction L. It is possible, as also in all the exemplary embodiments, for the contact metallization 4 not to extend as far as the facets 33.

In contrast to what is shown, the ridge laser 1 can comprise at the facets 33 further passivation layers or optically active layers such as antireflection layers or highly reflective mirror layers.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 10 2012 106 687.6, the disclosure content of which is hereby incorporated by reference.

The invention claimed is:

1. A ridge laser comprising
   a semiconductor layer sequence comprising an active zone,
   a waveguide also designated as ridge, having a width, wherein the waveguide is shaped as an elevation from the semiconductor layer sequence,
   a contact metallization, which is applied on a top side of the waveguide facing away from the active zone, and
   an energization layer, which is in direct contact with the contact metallization and via which the contact metallization is electrically connected,
   wherein
   an energization width of at least one of the active zone and the waveguide is less than the width of the waveguide,
   the waveguide is spaced apart from the active zone,
   the top side is only partly covered by the contact metallization with a contact width, and the contact width is less than the width of the waveguide,
   the energization layer touches the top side in places,
   a distance between the contact metallization and an edge of the top side is at least 0.15 µm and at least 2.5% of the width of the waveguide, and
   a passivation layer is situated in places between the semiconductor layer sequence and the energization layer.

2. The ridge laser according to claim 1, wherein an energization width of the active zone as well as of the waveguide is less than the width of the waveguide.

3. The ridge laser according to claim 1, wherein the following holds true for the contact width M, the width B of the waveguide (3) and a coverage portion S:
   0.05B≤M≤0.8B and 0.3(B−M)≤S≤(B−M),
   wherein the coverage portion S is that portion of the top side of the waveguide which, in a direction parallel to the width of the waveguide, is in direct contact with the energization layer.

4. The ridge laser according to claim 1, wherein a plurality of strips of the contact metallization are fitted to the top side,
   wherein adjacent strips run parallel and are at a distance from one another of between 1 µm and 6 µm inclusive, and
   wherein a total width of all the strips together is at least 25% and at most 80% of the width of the waveguide.

5. The ridge laser according to claim 1, wherein the energization layer touches flanks of the waveguide in places,
   wherein, as viewed in cross section, the flanks are in direct contact with the energization layer in a proportion of at most 80%, and
   wherein an angle between the flanks and the active zone is 90°, as viewed in cross section, and with a tolerance of at most 15°.

6. The ridge laser according to claim 1, which is fashioned as a monomode laser and the width of the waveguide is between 1 µm and 4 µm inclusive.

7. The ridge laser according to claim 1, wherein the semiconductor layer sequence is based on AlInGaN and a distance between the waveguide and the active zone is between 30 nm and 400 nm inclusive.

8. The ridge laser according to claim 1, wherein the contact metallization is shaped from such a material such that an ohmic contact is formed with the semiconductor layer sequence,
   wherein the energization layer is shaped from a different material such that a non-ohmic contact is formed with the semiconductor layer sequence, and wherein the material of the contact metallization relative to the semiconductor layer sequence has a higher work function than the material of the energization layer.

9. The ridge laser according to claim 1, wherein the contact metallization comprises or consists of Pd or Pt,
wherein the energization layer comprises or consists of Au or Ti.

10. The ridge laser according to claim 1, wherein a height of the waveguide is between 200 nm and 1.2 µm inclusive.

11. The ridge laser according to claim 1, wherein the semiconductor layer sequence comprises at least one current blocking layer,
wherein the current blocking layer is at a distance of at most 1000 nm from the active zone,
wherein the current blocking layer has an opening, which, as seen in plan view, is covered by the waveguide and has a smaller width than the waveguide.

12. The ridge laser according to claim 11, wherein the current blocking layer or one of the current blocking layers is situated at a side of the active zone facing away from the waveguide.

13. The ridge laser according to claim 11, wherein the current blocking layer or one of the current blocking layers is situated within the waveguide.

14. The ridge laser according to claim 11, wherein a width of the opening and the width of the waveguide deviate from one another by at most a factor of 2.

15. The ridge laser according to claim 11, wherein the semiconductor layer sequence comprises at least one charge carrier blocking layer,
wherein a distance between the current blocking layer and the charge carrier blocking layer is at most 400 nm, and
wherein the active zone is situated between the charge carrier blocking layer and the current blocking layer.

16. The ridge laser according to claim 11, wherein the semiconductor layer sequence comprises at least one charge carrier blocking layer,
wherein the charge carrier blocking layer is situated between the active zone and the current blocking layer.

17. The ridge laser according to claim 11, wherein the semiconductor layer sequence comprises at least one charge carrier blocking layer,
wherein the current blocking layer is situated between the active zone and the charge carrier blocking layer.

18. The ridge laser according to claim 1, which is fashioned as a multimode laser and the width of the waveguide is between 2 µm and 200 µm inclusive.

19. A ridge laser comprising
a semiconductor layer sequence comprising an active zone,
a waveguide also designated as ridge, having a width, wherein the waveguide is shaped as an elevation from the semiconductor layer sequence,
a contact metallization, which is applied on a top side of the waveguide facing away from the active zone, and
an energization layer, which is in direct contact with the contact metallization and via which the contact metallization is electrically connected,
wherein
an energization width of at least one of the active zone and the waveguide is less than the width of the waveguide,
the waveguide is spaced apart from the active zone,
the top side is only partly covered by the contact metallization with a contact width, and the contact width is less than the width of the waveguide,
the energization layer touches the top side in places,
a distance between the contact metallization and an edge of the top side is at last 0.15 µm and/or at least 2.5% of the width of the waveguide,
a passivation layer is situated in places between the semiconductor layer sequence and the energization layer, and the passivation layer partly covers the top side,
the contact metallization is shaped from such a material such that an ohmic contact is formed with the semiconductor layer sequence, and
the energization layer is shaped from a different material such that a non-ohmic contact is formed with the semiconductor layer sequence.

* * * * *